United States Patent [19]

Shimamoto et al.

[11] Patent Number: 4,865,193
[45] Date of Patent: Sep. 12, 1989

[54] TAPE CARRIER FOR TAPE AUTOMATED BONDING PROCESS AND A METHOD OF PRODUCING THE SAME

[75] Inventors: Haruo Shimamoto; Tetsuya Ueda, both of Itami City, Japan

[73] Assignee: Mitsubishi Denki Kabushiki Kaisha, Japan

[21] Appl. No.: 210,086

[22] Filed: Jun. 22, 1988

[30] Foreign Application Priority Data

Jun. 23, 1987 [JP] Japan .................... 62-157078

[51] Int. Cl.⁴ .................... B65D 85/30; B65D 73/02; H05K 5/00
[52] U.S. Cl. .................... 206/330
[58] Field of Search .................... 206/330, 332

[56] References Cited

U.S. PATENT DOCUMENTS 4,438,847  3/1984  Fritz .................... 206/330
4,812,421  3/1989  Jung et al. .................... 206/330 XR

*Primary Examiner*—Allen M. Ostrager
*Attorney, Agent, or Firm*—Leydig, Voit & Mayer

[57] ABSTRACT

A tape carrier utilized in the tape automated bonding of semiconductor chips is disclosed which comprises a polyimide tape-shaped film having apertures therein, and patterns of leads and reinforcing members formed on a surface of the film. The reinforcing members may be made of the same material as the leads, such as copper, and formed by a single photoetching process on the film. The reinforcing members are disposed on those areas of the film which lie outside of the leads and which are subjected to stress during the sealing of the semiconductor chips into a resinous mold subsequent to the inner lead bonding thereof. For example, the reinforcing members may be disposed in the lead supporting zones of the film, or around the corners of the outer-lead apertures. The reinforcing members reduces the stresses exerted on the leads during the molding of the chips, so that the deformations thereof during the same process are minimized.

4 Claims, 4 Drawing Sheets

FIG. I (a)
PRIOR ART
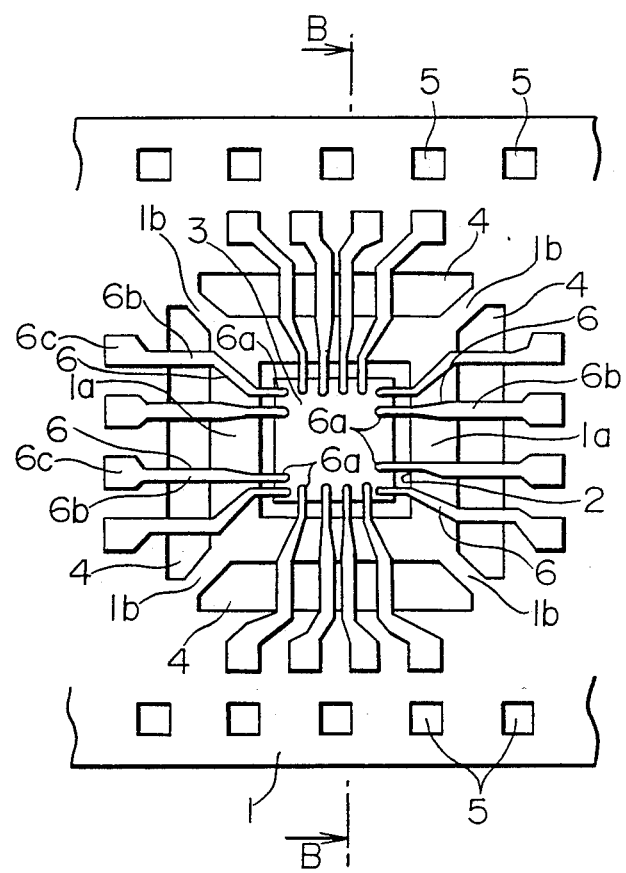
FIG. I (b)
PRIOR ART
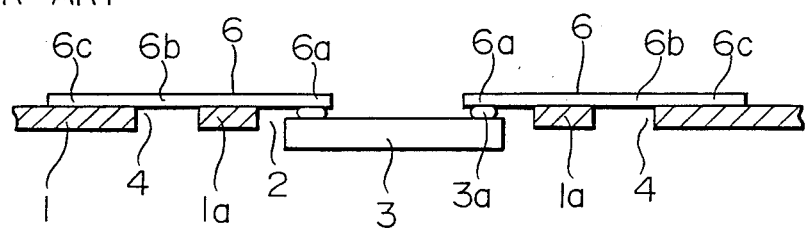

TAPE CARRIER FOR TAPE AUTOMATED BONDING PROCESS AND A METHOD OF PRODUCING THE SAME

BACKGROUND OF THE INVENTION

1. Field of the Invention

This invention relates to tape carriers utilized in the tape automated bonding of leads to semiconductor chips, such as integrated circuits, and more particularly to such tape carriers which are suitable to be used in the molding of semiconductor chips into a resinous mold after the inner bonding of the leads on the chips.

2. Description of the Prior Art

Conventionally, the electrical connections of the electrodes of semiconductor chips, such as integrated circuit elements, to outer circuits have been effected by means of outer leads of a package which are bonded to the electrodes of the chips trough thin bonding wires. In recent years, however, wireless bonding methods have been developed and are replacing the wire bonding method in an increasingly wide areas of applications as methods of making electrical connections of the electrodes of the chips to outer circuits.

The tape automated bonding method of the semiconductor chips is one of the most promising among the wireless bonding methods of the electrodes of the chips. FIGS. 1(a) and (b) of the drawings show a conventional tape carrier utilized in the tape automated bonding process. The flexible tape-shaped film 1 has formed therein repeating patterns of apertures 2 and 4 (a pattern only is shown in the figure). Further, patterns of leads are formed on a surface of the film 1 so that each pattern of leads 6 surrounds the central aperture 2, extending approximately in a direction perpendicular to the sides of the aperture 2. Semiconductor chips 3 are bonded to the leads 6 in the inner lead bonding process at the inner lead portions 6a thereof by means of the bumps 3a, i.e., projecting electrodes for the bonding of the chips. In certain applications, the semiconductor chips 3 thus carried by the tape 1 are put in a transfer molding press and sealed into a resinous mold or package together with predetermined portions of the leads 6.

The conventional tape carrier shown in FIG. 1 has following disadvantages when utilized in the molding of the chips. Namely, the fine patterns of leads 6 are subjected to severe stress during the molding process due to the fact that the clamping force of the molding dies of the molding press exerted on the leads and those portions of the film 1 that are situated in the cavity of the molding device is mainly born by the leads 6 which are less flexible and more resistant to mechanical pressure than the film 1. Thus, the thin leads 6 may easily be deformed during the molding process.

SUMMARY OF THE INVENTION

Thus, a main object of the present invention is to provide a tape carrier utilized in the tape automated inner lead bonding process and, thereafter, in the sealing of the semiconductor chips into a resinous mold, wherein the deformations of the leads due to the stress exerted thereon during the molding process are minimized.

a further object of the present invention is to provide a method of producing such carrier tapes efficiently and economically.

The main object of the present invention is accomplished by a tape carrier according to the present invention which comprises an elongated tape-shaped film, repeating patterns of leads disposed thereon, and reinforcing means for reinforcing the film and the leads during the molding of semiconductor chips into respective resinous molds. The film is made of a flexible material such as polyimide and have patterns of apertures formed therein. The repeating patterns of leads are made, for examples, of copper, and are formed in registry with the patterns of apertures in the film, so that each pattern of leads surrounds the central aperture for receiving the semiconductor chip. The reinforcing means comprises plate-shaped members of high mechanical strength disposed on the same surface as that on which the leads are formed. The reinforcing members may be of the same material as the leads and are positioned in such areas of the film that are situated outside the leads and are subjected to mechanical stresses during the molding of the semiconductor chips.

According to a method of the present invention, the carrier tape as described above is produced by forming the leads and the reinforcing members from a layer of the same electrically conducting material adhered on a main surface of the film in a single photoetching process.

BRIEF DESCRIPTION OF THE DRAWINGS

Further details of the present invention will become more clear in the following detailed description of the preferred embodiments, taken in conjunction with the attached drawings, in which:

FIG. 1 (a) is a partial plan view of a conventional tape carrier with a semiconductor chip, in which a portion thereof comprising a pattern of leads and that of apertures are shown;

FIG. 1(b) is a sectional view of the tape carrier of FIG. 1, showing a cross section thereof along the line B—B in FIG. 1(a);

In the figures, like reference numerals represent like or similar elements or portions.

DETAILED DESCRIPTION OF THE PREFERRED EMBODIMENTS

Figure 2:
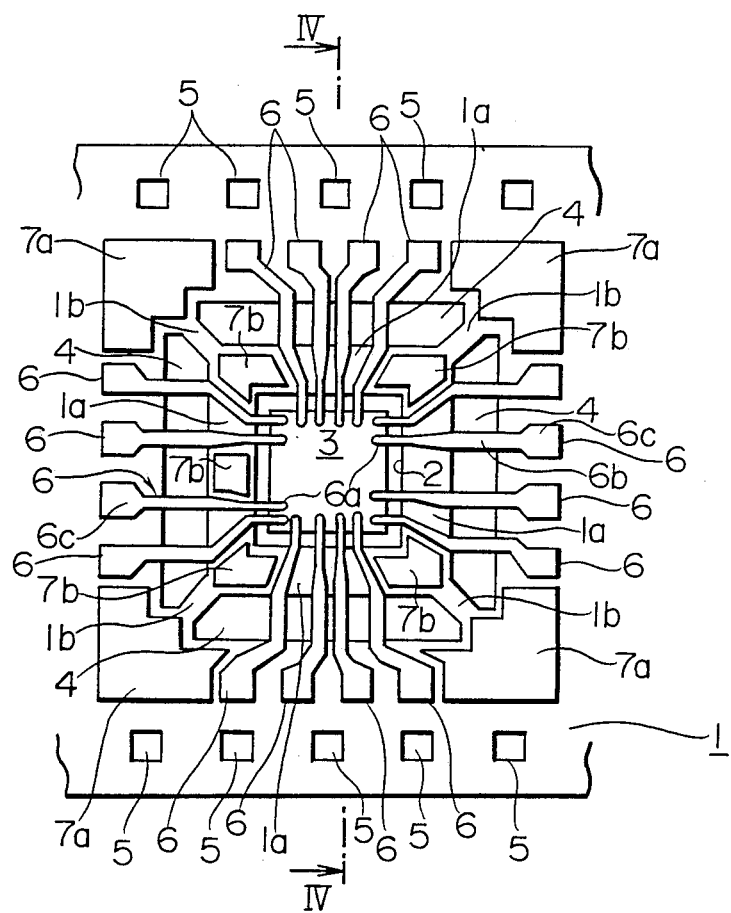
FIG. 2 is a view similar to that of FIG. 1(a), but showing a tape carrier according to the present invention.

Referring now to FIG. 2 of the drawings, the first embodiment of the present invention is described.

An elongated tape-shaped film 1 is made of an electrically insulating flexible material such as a polyimide resin having a good heat-resistant quality, and has formed therein patterns of apertures repeating at predetermined intervals in the longitudinal direction thereof. As shown in the figure, each pattern of apertures comprises a central square aperture 2 for receiving a semiconductor chip 3, and four elongated outer-lead apertures 4 arranged in the form of a square surrounding the central aperture 2 on the four sides thereof, the four outer-lead apertures 4 being separated from the central aperture 2 by lead supporting zones 1a of the film 1, having the form of a square ring and from each other by narrow bridging stripe zones 1b of the film 1 which bridges the zones 1a to the main areas of the film 1. The outer-lead apertures 4 are outer lead bonding operation. Two rows of perforations 5, on the other hand, are formed in the film 1 at a fixed pitch along the two sides of the film 1, and are utilized for forwarding and approximate positioning of the film 1 with respect to the semiconductor chips 3 during the inner lead bonding operations.

Repeating patterns of leads 6 made of an electrically conducting metallic material such as copper are formed and disposed on one of the main surfaces of the film 1. As shown in the figure, each pattern of leads 6 are formed over an associated pattern of apertures, so that the leads 6, each comprising inner lead portion 6a, outer lead portion 6b and test pad portion 6c, are arranged in such a way as to surround the central aperture 2 of the associated pattern of apertures, the inner lead portions 6a thereof extending into the central aperture 2, and outer lead portions 6b thereof extending across the outer-lead apertures 4 of the associated pattern.

Thin reinforcing plate-shaped member 7a and 7b made of a material of a high mechanical strength are disposed on the same main surface of the film 1 as the leads 6 in those areas thereof that are free of the leads 6 and are subjected to a mechanical pressure during the sealing of the chips 3 into resinous molds. Thus, in the area of this embodiment, the four members 7a are disposed on the four corner zones around the outer-lead apertures 4; the other five members 7b, on the other hand, are disposed in the lead supporting zones 1a of the film 1 where relatively wide areas are left between neighboring leads 6. The plates 7a and 7b of this embodiment are made of the same electrically conducting metallic material as the leads 6, and are formed simultaneously therewith.

The tape carrier of FIG. 2 may be produced as follows. First, a sheet of polyimide film is cut into tapes 1 of a predetermined width. Next, perforations 5 and the repeating patterns of apertures 2 and 4 are formed by a punch in the tape-shaped film 1. Then, after a thin foil of copper is adhered through an intermediary layer of an adhesive material on a main surface of the film 1, the repeating patterns of leads 6 and the reinforcing members 7a and 7b are formed therefrom simultaneously by the photoetching method. Finally, the leads 6 are plate with a bond making metal, such as tin, for the purpose of ensuring reliable bonding thereof with the electrodes of semiconductor chips 3.

Figure 3:
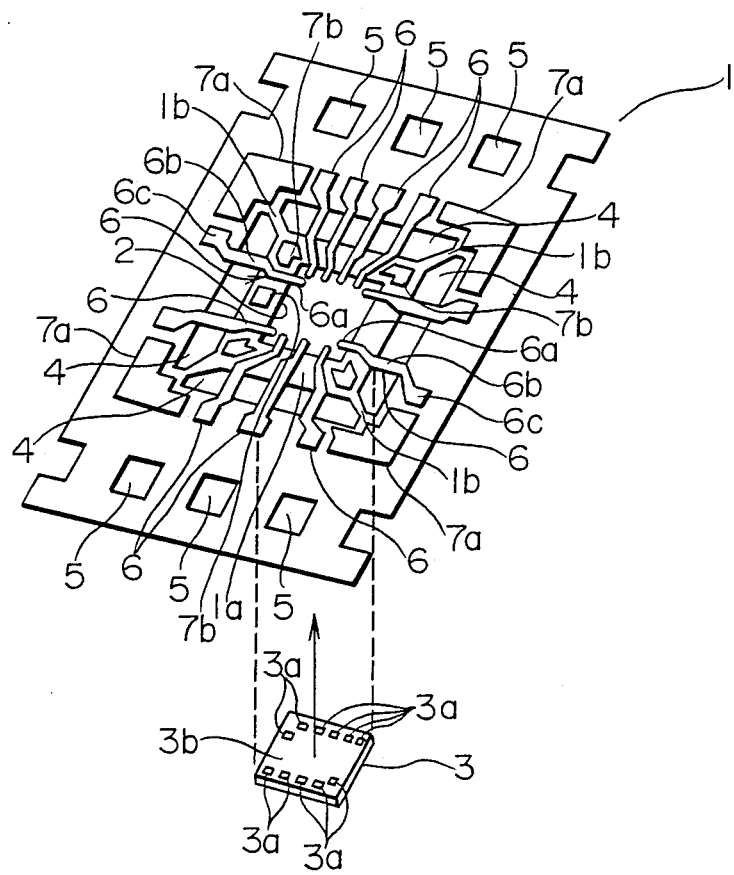
FIG. 3 is a perspective view of the tape carrier of FIG. 2, showing the same portion of the tape carrier as that of FIG. 2 together with a semiconductor chip which is being bonded to the leads on the carrier.

The tape carrier of FIG. 1 is utilized in the tape automated inner lead bonding process as follows. As shown schematically in FIG. 3 of the drawings, semiconductor chips, such as integrated circuits or transistors, which are to be bonded to the leads 6 in the tape automated bonding process has a plurality of bumps 3a, i.e., projecting electrodes of gold for outer connections, formed on a main surface thereof. The semiconductor chips 3 are ordered on a tray or a nest plate (not shown) with the surface 3b having the bumps 3a facing upward. The chip 3 at the end of chips thus ordered on the rest plate is placed in alignment with an associated central aperture 2 of the pattern of apertures formed in the film 1 which is positioned above and over the ordered chips 3 and is forwarded each time stepwise by a distance equal to the pitch of the perforations 5 thereof. The bumps 3a of the chip 3 at the top of the line the chips are thus put in registry with the associated inner lead portions 6a of the leads 6 surrounding the central aperture which is in alignment with the chip 3. Then, a bonding tool (not shown), such as a constant temperature thermode, is lowered onto the surface 3b of the chip 3 in alignment with the central aperture 2, to bond the bumps 3a of the chip 3 to the associated inner lead portions 6a of the leads 6 by an application of heat and pressure. Thus, inner lead bonding of the chip 3 is completed by the formation of gold-tin eutectic alloy.

Figure 4:
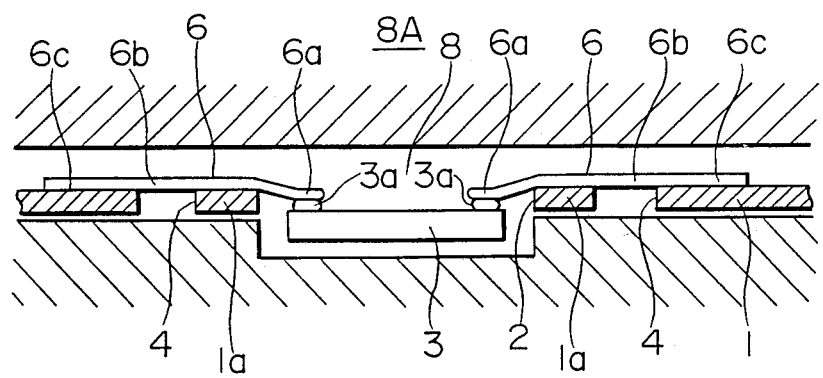
FIG. 4 is a sectional view of the tape carrier of FIG. 2 showing a part of a cross section thereof along the line IV—IV in FIG. 2 which is placed in a cavity of a molding device.

Subsequent to the inner lead bonding, the chips 3 may be sealed into a resinous mold. Thus, as shown in FIG. 4 of the drawings, each chip 3 on the film 1 is placed in a cavity 8 formed by the upper and lower molding dies 8A and 8B of a transfer molding device. Then, an amount of preheated thermosetting resin, such as epoxy or silicone resin, is injected into the cavity 8 and is set therein to seal the chip 3 into a resinous mold or package. The upper and lower molding dies 8A and 8B are clamped together during the molding process.

Due to the disposition of the reinforcing members 7a and 7b on the film 1 according to the present invention, the pressure exerted on the leads 6 by the clamping force of the molding dies 8A and 8B is shared by the reinforcing members 7a and 7b during the molding process. Thus, the bending stresses exerted on the fine pattern of leads 6 are substantially diminished, and therefore the deformations thereof during the molding process are minimized according to the present invention.

Figure 5:
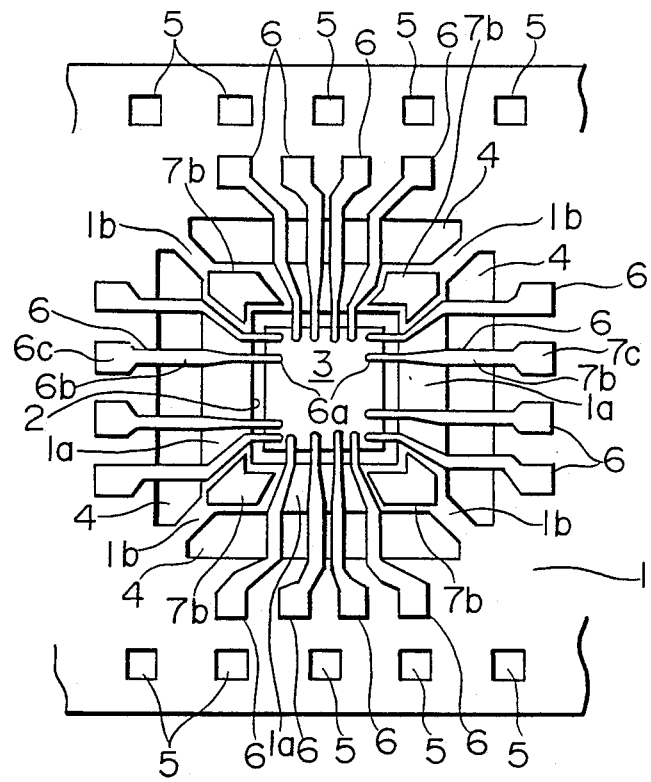
FIG. 5 is a view similar to that of FIG. 2, but showing another tape carrier according to the present invention.

Referring now to FIG. 5 of the drawings a second embodiment of the present invention is described.

The tape carrier of FIG. 5 has a structure similar to that of the tape carrier of FIG. 2, and produced and utilized similarly. However, the tape carrier of FIG. 5 has only those reinforcing members 7b disposed at the corners of the lead supporting zones 1a of the film 1. Otherwise, this tape carrier has a structure and production and utilization methods similar to those of FIG. 2, and the description thereof is omitted herein.

Figure 6:
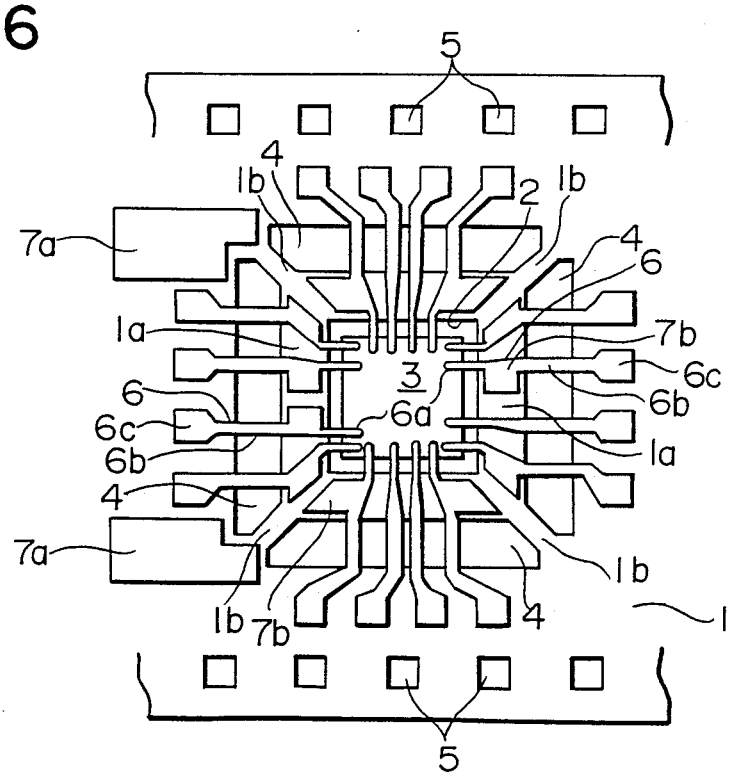
FIG. 6 is a view similar to those of FIGS. 2 and 5, but showing still another tape carrier according to the present invention.

FIG. 6, on the other hand, shows a third embodiment of the present invention. In the case of this embodiment, the reinforcing members 7b situated in the lead supporting zones 1a of the film 1 are integral with one of the leads 6. Electrically connection of neighbouring leads 6 through the reinforcing members 7b made of an electrically conducting material is avoided by separating those reinforcing members that are integral with the neighboring leads. The reinforcing members 7a outside of the outer-lead apertures 4 are disposed only around two adjacent corners of the outer-lead apertures 4 which are at the ends of an aperture 4 extending in the widthwise direction of the film 1, but are elongated in the longitudinal direction of the film 1. Otherwise, the structure and the production and utilization methods of the tape carrier of FIG. 6 is similar to those of FIG. 2, and the description thereof is omitted herein.

Although the present invention has been described referring to particular embodiments, it should be understood that the present invention can be subject to many modifications without departing from the spirit and scope of the present invention. For example, the reinforcing members 7a and 7b may be formed on the tape-shaped film 1 by a process which is distinct from that utilized in the formation of the pattern of the leads 6, although the efficiency of production is somewhat diminished in this case by the necessity of adopting an additional step. Further, positions and the forms of the reinforcing members 7a and 7b may be subjected to many modifications. For example, the reinforcing members may be disposed only around the corners of the four outer-lead apertures 4 arranged in a square ring form.

What is claimed is:

1. A tape carrier for bonding electrically conducting leads to electrodes of semiconductor chips and for supporting the semiconductor chips and associated patterns of leads bonded thereto during a sealing of the semiconductor chips into respective resinous molds, comprising:

an elongated tape-shaped film of a flexible material having formed therein repeating patterns of apertures, each pattern of apertures including a central aperture for receiving a semiconductor chip;

repeating patterns of leads of an electrically, conducting metallic material disposed on a main surface of said film, each pattern of leads surrounding said central aperture in each one of the patterns of apertures, and each lead extending substantially perpendicularly to a side of said central aperture; and reinforcing means for reinforcing said film and leads during a molding of semiconductor chips into respective resinous molds, said reinforcing means comprising plate-shaped members of a high mechanical strength disposed on said main surface of said film in areas thereof which lie outside of said leads and are subjected to a mechanical pressure during a sealing of the semiconductor chips into resinous molds.

2. A tape carrier as claimed in claim 1, wherein said leads and said plate-shaped members are made of a same electrically conducting metallic material.

3. A tape carrier as claimed in claim 2, wherein said reinforcing means comprises plate-shaped members which are integral with said leads.

4. A method of producing a step carrier as claimed in claim 2, comprising the steps of:

forming said repeating pattern of apertures in an elongated tape-shaped film of a flexible material; and forming on said main surface of the film said repeating patterns of leads and said plate-shaped members of reinforcing means by a single photoetching process.

* * * * *